(12) United States Patent
Basker et al.

(10) Patent No.: US 9,018,686 B2
(45) Date of Patent: Apr. 28, 2015

(54) DUAL GATE FINFET DEVICES

(71) Applicant: International Business Machines Corporation, Armonk, NY (US)

(72) Inventors: Veeraraghavan S. Basker, Schenectady, NY (US); Effendi Leobandung, Wappinger Falls, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/672,925

(22) Filed: Nov. 9, 2012

(65) Prior Publication Data
US 2014/0117447 A1     May 1, 2014

Related U.S. Application Data

(63) Continuation of application No. 13/666,031, filed on Nov. 1, 2012.

(51) Int. Cl.
*H01L 29/66*     (2006.01)
*H01L 21/8234*     (2006.01)
*H01L 27/088*     (2006.01)
*H01L 29/78*     (2006.01)

(52) U.S. Cl.
CPC .. *H01L 29/66795* (2013.01); *H01L 21/823462* (2013.01); *H01L 21/823431* (2013.01); *H01L 27/0886* (2013.01); *H01L 29/785* (2013.01)

(58) Field of Classification Search
CPC ............ H01L 29/66795; H01L 29/785; H01L 27/0886; H01L 21/823462; H01L 21/823431
USPC ........... 257/288, 401, 406, 329, 392, E29, 22, 257/E29.022
See application file for complete search history.

(56) References Cited

U.S. PATENT DOCUMENTS

| | | |
|---|---|---|
| 5,985,725 A | 11/1999 | Chou |
| 6,645,797 B1 | 11/2003 | Buynoski et al. |
| 6,864,164 B1 | 3/2005 | Dakshina-Murthy et al. |
| 7,115,945 B2 * | 10/2006 | Lee et al. ...................... 257/329 |
| 7,446,049 B2 | 11/2008 | Kim et al. |
| 7,824,983 B2 | 11/2010 | Juengling |

(Continued)

OTHER PUBLICATIONS

N. Horiguchi et al., "High yield sub-0.1 μm2 6T-SRAM cells, featuring high-k/metal-gate finfet devices, double gate patterning, a novel fin etch strategy, full-field EUV lithography and optimized junction design & layout,"), 2010 Symposium on VLSI Technology, VLSIT, Jun. 15-17, 2010, pp. 23-24.

(Continued)

*Primary Examiner* — Michael Trinh
(74) *Attorney, Agent, or Firm* — Harrington & Smith

(57) ABSTRACT

A device comprises: a first plurality of fins on a semiconductor substrate, the first plurality of fins including a semiconductor material and extending perpendicular from the semiconductor substrate; a second plurality of fins on the semiconductor substrate, the second plurality of fins including a semiconductor material and extending perpendicular from the semiconductor substrate; a chemox layer deposited on lower portions of the fins of the first plurality of fins; and a dielectric layer deposited on the fins of the second plurality of fins. The dielectric layer is thicker than the chemox layer.

8 Claims, 4 Drawing Sheets

(56) References Cited

U.S. PATENT DOCUMENTS

| | | | |
|---|---|---|---|
| 7,855,105 | B1 | 12/2010 | Jagannathan et al. |
| 7,915,108 | B2 | 3/2011 | Jang et al. |
| 8,217,435 | B2 * | 7/2012 | Chang et al. ............ 257/288 |
| 2005/0205944 | A1 | 9/2005 | Clark, Jr. et al. |
| 2005/0280104 | A1 | 12/2005 | Li |
| 2007/0111448 | A1 * | 5/2007 | Li et al. ............ 438/264 |
| 2007/0120154 | A1 * | 5/2007 | Zhu et al. ............ 257/288 |
| 2009/0057765 | A1 | 3/2009 | Zhu et al. |
| 2009/0108366 | A1 | 4/2009 | Chen et al. |
| 2009/0179283 | A1 | 7/2009 | Adams et al. |
| 2011/0068400 | A1 | 3/2011 | Wang et al. |
| 2012/0018730 | A1 | 1/2012 | Kanakasabapathy et al. |

OTHER PUBLICATIONS

T. Vandeweyer et al., "Patterning challenges in setting up a 16nm node 6T-SRAM device using EUV lithography," Proc. of SPIE, vol. 7969, 2011, 79691K, 12 pages.

O. Luere et al., "Etch mechanisms of silicon gate structures patterned in SF6/CH2F2/Ar inductively coupled plasmas," Journal of Vacuum Science & Technology B: Microelectronics and Nanometer Structures, vol. 29, No. 1, Jan. 2011, 011028, 10 pages.

D. Shamiryan et al., "Dry etching process for bulk finFET manufacturing," Microelectronic Engineering, vol. 86, Issue 1, Jan. 2009, pp. 96-98.

Cai, Cathy, et al.; "Defect Gallery and Bump Defect Reduction in the Self Aligned Double Patterning Module," Advanced Semiconductor Manufacturing Conference, 2010 IEEE/SEMI, IEEE, Piscataway, NJ, USA, Jul. 11, 2019, pp. 129-132.

* cited by examiner

DUAL GATE FINFET DEVICES

CROSS REFERENCE TO RELATED APPLICATION

This application is a continuation of copending U.S. patent application Ser. No. 13/666,031, filed Nov. 1, 2012, the disclosure of which is incorporated by reference herein in its entirety.

BACKGROUND

The exemplary embodiments of this invention relate generally to field effect transistors (FETs) and, more specifically, to processes for making finFET devices.

Semiconductors and integrated circuit chips have become ubiquitous within many products due to their continually decreasing cost and size. In the microelectronics industry as well as in other industries involving construction of microscopic structures (such as micromachines, magnetoresistive heads, etc.) there is a continued desire to reduce the size of structural features and microelectronic devices and/or to provide a greater amount of circuitry for a given chip size. Miniaturization, in general, allows for increased performance (more processing per clock cycle and less heat generated) at lower power levels and lower cost. Present technology is at or approaching atomic level scaling of certain micro-devices such as logic gates, field effect transistors (FETs), and capacitors. Circuit chips with hundreds of millions of such devices are not uncommon. Further size reductions appear to be approaching the physical limit of trace lines and micro-devices that are embedded upon and within their semiconductor substrates.

BRIEF SUMMARY

In one exemplary aspect, a method comprises: forming a first array of fins and a second array of fins on a substrate; masking off the first array of fins from the second array of fins with a first mask; depositing a dielectric layer on the second array of fins and on the first mask on the first array of fins; masking off the dielectric layer deposited on the second array of fins with a second mask; removing the dielectric layer and the first mask from the first array of fins; removing the second mask from the second array of fins to expose the dielectric layer on the second array of fins; and depositing a chemox layer on the first array of fins. The chemox layer is thinner than the dielectric layer on the second array of fins.

In another exemplary aspect, a method comprises: forming a first array of fins and a second array of fins on a substrate, the fins having a dielectric material on a top of each fin; patterning the dielectric material and the fins; depositing an amorphous carbon layer on the first array of fins; patterning the amorphous carbon layer; depositing a first photoresist layer on the amorphous carbon layer; patterning the first photoresist layer; depositing an overlayer on the first photoresist layer and on the second array of fins; patterning the overlayer; depositing a second photoresist layer on a portion of the overlayer on the second array of fins; patterning the second photoresist layer; removing the overlayer from the first photoresist layer; removing the first photoresist layer and the second photoresist layer; removing the amorphous carbon layer; and depositing a chemox layer on the first array of fins.

In another exemplary aspect, a method comprises: forming a first array of fins defining an SG device and a second array of fins defining an EG device on a substrate, the fins having a dielectric material on a top of each fin; patterning the dielectric material and the fins; depositing an amorphous carbon layer on the fins defining the SG device; patterning the amorphous carbon layer; depositing a first photoresist layer on the amorphous carbon layer; patterning the first photoresist layer; depositing an overlayer on the first photoresist layer and on the fins defining the EG device; patterning the overlayer; depositing a second photoresist layer on a portion of the overlayer on the fins defining the EG device; patterning the second photoresist layer; applying a sequence of acids in a wet etching process to remove the overlayer from the first photoresist layer, the first photoresist layer from the amorphous carbon layer, the second photoresist layer from the overlayer on the fins defining the EG device, and the amorphous carbon layer on the fins defining the SG device, leaving the overlayer on the fins defining the EG device; and depositing a chemox layer on the fins defining the SG device.

In another exemplary aspect, a method comprises: applying hydrofluoric acid to remove a portion of a dielectric layer on a first photoresist mask on an amorphous carbon layer on fins defining an SG device; applying sulfuric acid to remove the first photoresist mask on the amorphous carbon layer on the fins defining the SG device and to remove a second photoresist mask and a dielectric layer on fins defining an EG device; applying sulfuric acid to remove the amorphous carbon layer on the fins defining the SG device; and applying hydrochloric acid to the fins defining the SG device and the dielectric layer on the fins defining the EG device as a surface treatment.

In another exemplary aspect, a device comprises: a first plurality of fins on a semiconductor substrate, the first plurality of fins including a semiconductor material and extending perpendicular from the semiconductor substrate; a second plurality of fins on the semiconductor substrate, the second plurality of fins including a semiconductor material and extending perpendicular from the semiconductor substrate; a chemox layer deposited on lower portions of the fins of the first plurality of fins; and a dielectric layer deposited on the fins of the second plurality of fins. The dielectric layer is thicker than the chemox layer.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

A field effect transistor (FET) is a transistor having a source, a gate, and a drain. The action of the FET depends on the flow of majority carriers along a channel that runs past the gate and between the source and drain. Current through the channel between the source and drain may be controlled by a transverse electric field under the gate. The length of the gate determines how fast the FET switches, and can be about the same as the length of the channel (such as the distance between the source and drain).

More than one gate (multi-gate) can be used to more effectively control the channel. Multi-gate FETs are considered to be promising candidates to scale down complementary metal-oxide semiconductor (CMOS) FET technology. However, the smaller dimensions associated with multi-gate FETs (as compared to single-gate FETs) necessitate greater control over performance issues such as short channel effects, punch-through, metal-oxide semiconductor (MOS) leakage current, and the parasitic resistance that is present in a multi-gate FET.

The size of FETs has been successfully reduced through the use of one or more fin-shaped channels. A FET employing such a channel structure may be referred to as a finFET. Previously, CMOS devices were substantially planar along the surface of the semiconductor substrate, the exception being the FET gate that was disposed over the top of the channel. FinFETs, however, use a vertical channel structure to maximize the surface area of the channel that is exposed to the gate. The gate controls the channel more effectively in a finFET because the gate extends over more than one side (surface) of the channel. For example, the gate can enclose three surfaces of the three-dimensional channel, rather than being disposed only across the top surface of the traditional planar channel.

FinFETs may also be used to define more than one type of dielectric device on one semiconductor substrate. For example, both a thin gate dielectric device (SG) and a thick gate dielectric device (EG) can be employed on the same semiconductor substrate. In manufacturing a CMOS device having both types of dielectric devices, a hard mask is generally deposited on the top of each of the fins, and a thick coating of silicon dioxide ($SiO_2$) is conformally deposited on the hard mask and sides of the fins. A photoresistive layer is then selectively applied to the fins of the SG device, and lithographic and etching techniques are used to remove the thick coating of $SiO_2$ not protected by the photoresistive layer.

Figure 1:
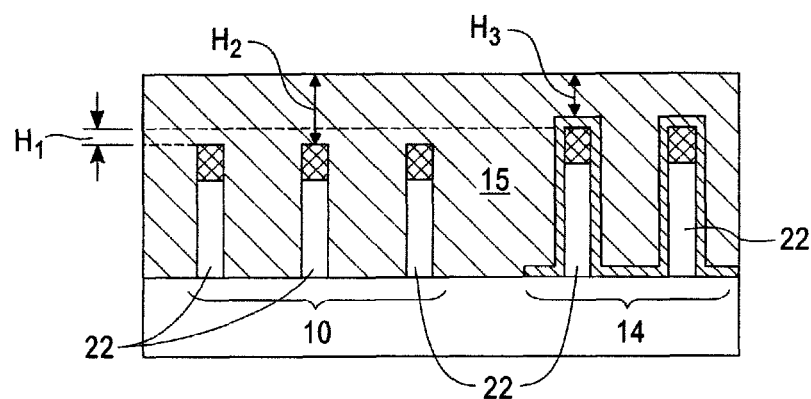
FIG. 1 is a cross-sectional view of a thin gate finFET and a thick gate finFET showing a difference in height with regard to the fins.

As shown in FIG. 1, however, upper surfaces of the fins 22 of the SG device (shown at 10) can be recessed during removal of the thick coating of $SiO_2$. This can result in the fins 22 of the SG device 10 being of a different height $H_1$ relative to the fins 22 of the EG device (shown at 14). Further deposition of a gate material (e.g., polysilicon) to form the gates 15 may cause a gate height $H_2$ of the SG device 10 to be different than a gate height $H_3$ of the EG device 14. The height difference between the two devices can cause variations (e.g., fringe capacitance) in the characteristics of each device.

As shown in FIGS. 2-5, one exemplary embodiment of a process for making dual- or multi-gate finFETs for a CMOS device is illustrated. FinFETs for such a CMOS device comprise SG devices 10 in which a first gate used with a first device is thin (hereinafter referred to as "thin gate finFETs 10") and EG devices 14 in which a second gate used with a second device is thicker (hereinafter referred to as "thick gate finFETs 14"). Each finFET 10, 14 comprises one or more fins 22. In a finished CMOS device incorporating the finFETs 10, 14, the fins 22 defining the thin gate finFETs 10 include thin $SiO_2$ coatings on at least portions thereof, and the fins 22 defining the thick gate finFETs 14 include thicker (as compared to the thin gate finFETs) $SiO_2$ coatings. Thin gate (SG) finFETs 10 are generally employed with low $V_{dd}$ logic circuits, and thick gate (EG) finFETs 14 are generally employed with high $V_{dd}$ input/output (I/O) circuits. The fins 22 of each finFET are located on and extend substantially perpendicular from a substrate 18. Top portions of each fin 22 include a dielectric hard mask 20 of $SiO_2$.

Figure 2:
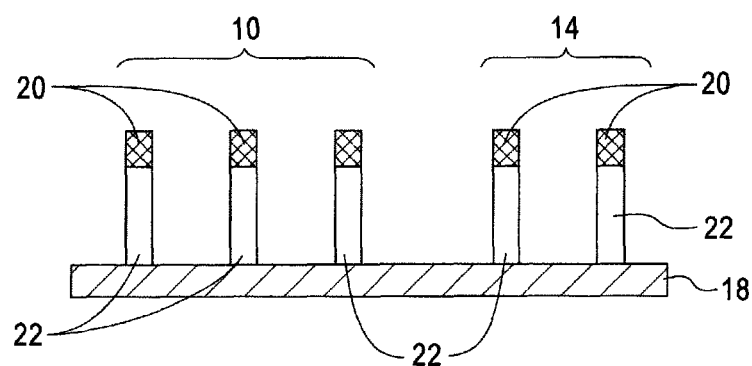
FIG. 2 is a cross-sectional view of finFETs during an initial stage of manufacture.

As shown in FIG. 2, a first stage in one exemplary embodiment of the process of manufacturing finFETs 10, 14 comprises forming arrays of the fins 22 on the substrate 18. Although three fins 22 are shown in an array for the thin gate finFET 10 and only two fins 22 are shown in an array for the thick gate finFET 14, any number of arrays containing any number of fins 22 may be employed. Within each array, the fins 22 are evenly spaced such that the distance between the adjacent fins 22 is the same for all fins.

The fins 22 comprise a semiconductor material such as single-crystal silicon, silicon alloy, germanium, germanium alloy, or both silicon and germanium. The substrate 18 comprises a semiconductor material such as single-crystal silicon, silicon alloy, germanium, or germanium alloy that has been doped with n-type or p-type dopants.

In one exemplary embodiment, the fins 22 are formed by depositing (e.g., by chemical vapor deposition (CVD) or sputter deposition) the semiconductor material onto the substrate 18 and subsequently depositing $SiO_2$ as the hard mask 20 on the semiconductor material. Portions of the materials are then removed to define the fins 22. The fins 22 defined by the remaining semiconductor material and the hard mask 20 deposited thereon are then patterned using a lithography technique and an etch technique (e.g., dry plasma etch). Once the fins 22 are formed on the substrate 18 and patterned, an anisotropic etch (e.g., reactive ion etch (RIE)) may be used to ensure that the fins 22 are clean of unwanted debris.

Figure 3:
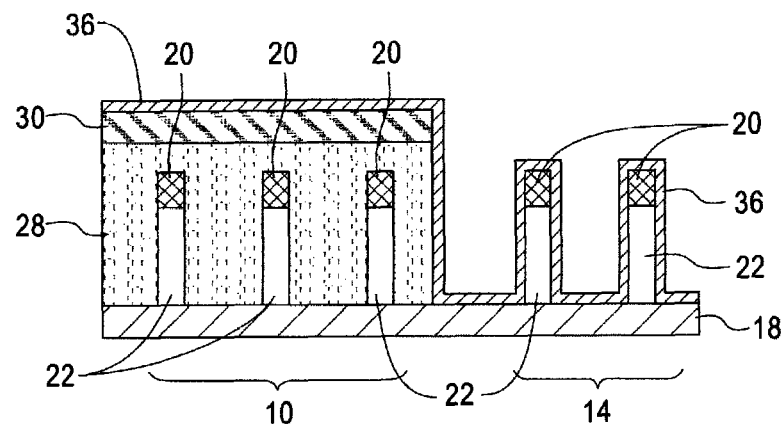
FIG. 3 is a cross-sectional view of the finFETs during a second stage of manufacture.

Referring now to FIG. 3, a second stage in one exemplary embodiment of the process of manufacturing finFETs 10, 14 comprises depositing a sacrificial amorphous carbon (a-C) layer 28 on the fins 22 of the finFET 10 and the finFET 14. The a-C layer 28 is deposited using a suitable deposition technique such as, but not limited to, advanced patterning film (APF) deposition (which is a form of plasma-enhanced chemical vapor deposition (PECVD)) to provide a mask. The a-C layer 28 is then lithographically patterned off of the finFET 14, thereby leaving the a-C layer 28 on the finFET 10.

A sacrificial first photoresist layer 30 is then deposited on the a-C layer 28 left on the finFET 10 and lithographically patterned. The deposited first photoresist layer 30 may then be etched (e.g., using RIE). The a-C layer 28 and the first photoresist layer 30 effectively mask off the fins 22 of the finFET 10 from the fins 22 of the finFET 14.

A dielectric overlayer 36 comprising $SiO_2$ is then deposited on substantially the entire upper surfaces of the finFET 10 and the finFET 14 to a thickness of about 20 Angstroms to about 50 Angstroms using a PECVD technique. The overlayer 36 on the finFET 14 provides the thicker (as compared to the thin gate finFET) $SiO_2$ coating thereon. In one exemplary embodiment, the PECVD technique used to deposit the overlayer 36 is IRAD, which is available from Tokyo Electron Ltd, Japan. IRAD is a plasma-enhanced batch thermal CVD system that uses an in-situ plasma source to allow film-forming chemical reactions to proceed at temperatures that are significantly lower than those typically employed for thermal CVD, such low temperatures being conducive to the fabrication of advanced logic and memory devices. The use of in-situ plasma also allows the overlayer 36 to be conformally deposited, thereby allowing for the resulting physical and electrical properties of the film to be precisely tailored to meet the desired requirements of the finFETs 10, 14 and the finished CMOS device.

Figure 4:
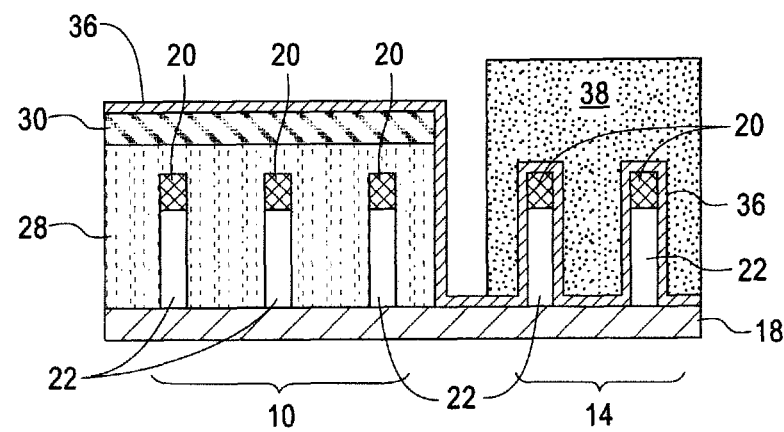
FIG. 4 is a cross-sectional view of the finFETs during a third stage of manufacture.

As shown in FIG. 4, a third stage in one exemplary embodiment of the process of manufacturing finFETs 10, 14 comprises depositing a sacrificial second photoresist layer on the portion of the overlayer 36 on the finFET 14. This second photoresist layer 38 is lithographically patterned and developed. The second photoresist layer 38 may be similar to the first photoresist layer 30 deposited on the a-C layer 28.

Figure 5:
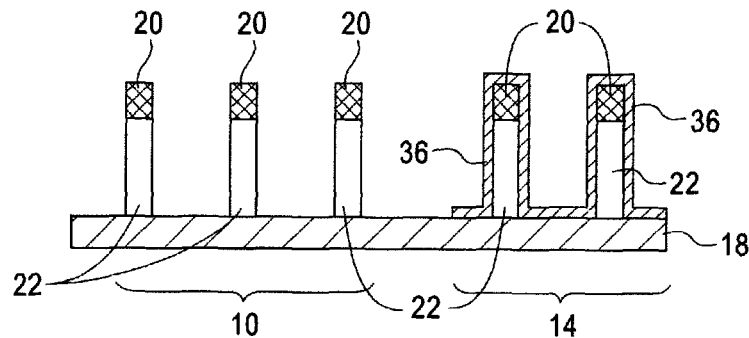
FIG. 5 is a cross-sectional view of the finFETs during a fourth stage of manufacture.

As shown in FIG. 5, a fourth stage in one exemplary embodiment of the process of manufacturing finFETs 10, 14 comprises using a wet etching process to sequentially remove the overlayer 36 from the finFET 10, the first photoresist layer 30, the second photoresist layer 38, and the a-C layer 28. The overlayer 36 is left on the finFET 14. This wet etching process employs the sequential application of hydrofluoric (HF), sulfuric ($H_2SO_4$), and hydrochloric (HCl) acids. The application of HF removes the PECVD-deposited overlayer 36 from the finFET 10. Subsequent application of the $H_2SO_4$ removes both photoresist layers 30, 38. The $H_2SO_4$ also removes the a-C layer 28, which prevents contact of the fins 22 of the finFET 10 by the HF. The HCl is then applied to treat the entire surface (both finFET 10 and finFET 14). Because the HCl has no impact on the portion of the overlayer 36 defined by the thicker $SiO_2$ coating on the finFET 14, this thicker $SiO_2$ coating remains.

By using the acids sequentially (i.e. HF, $H_2SO_4$, and HCl in that order), substantially all of the HF is removed from the finFETs 10, 14 before the first photoresist layer 30 and the a-C layer 28 are removed from the finFET 10 and the second photoresist layer 38 is removed from the finFET 14 by the $H_2SO_4$, thereby avoiding exposing the hard masks 20 on the fins 22 of the finFET 10 to the HF. This process prevents the formation of recesses in the hard masks 20 of the fins 22 of the finFET 10, such recesses being undesirable in the finished CMOS as causing height differences in the gates between the finFET 10 and the finFET 14.

Figure 6:
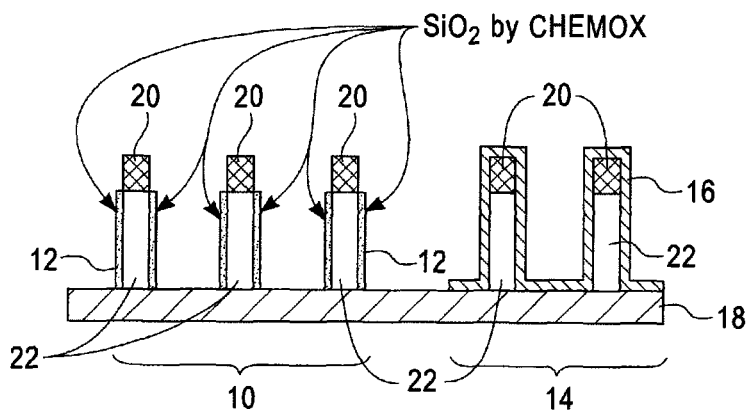
FIG. 6 is a cross-sectional view of the finFETs during a fifth stage of manufacture.

As shown in FIG. 6, a thin $SiO_2$ coating 12 is deposited on the fins 22 of the finFET 10 as a chemox layer. The chemox layer is deposited in-situ on the fins 22 of the finFET 10 via an oxidation or oxynitridation technique. Because the chemox layer is deposited at a low temperature (e.g., room temperature), oxides are grown only on the silicon of the fins 22 of the finFET 10 and not on the $SiO_2$ of the hard mask 20 or the thicker coating of $SiO_2$ on the finFET 14. When the substrate 18 contains silicon, the chemox layer can comprise silicon oxide, silicon oxynitride, or a nitrided silicon oxide. When the substrate 18 is other than a Si-containing semiconductor, the chemox layer may comprise a semiconducting oxide, a semiconducting oxynitride, or a nitrided semiconducting oxide. The thickness of the chemox layer is about 7 Angstroms to about 10 Angstroms.

Figure 7:
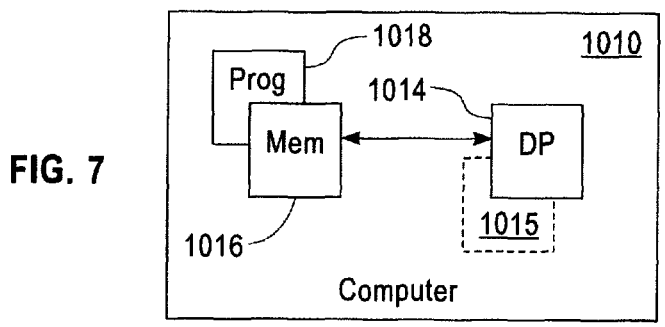
FIG. 7 is a simplified block diagram of exemplary electronic devices that are suitable for use in the manufacture of finFETs.

Referring now to FIG. 7, a simplified block diagram of various electronic devices and apparatus that are suitable for use in practicing the exemplary embodiments described herein is shown. For example, a computer 1010 may be used to control one or more of the lithography processes as described above. The computer 1010 includes a controller, such as a computer or a data processor (DP) 1014 and a computer-readable memory medium embodied as a memory (MEM) 1016 that stores a program of computer instructions (PROG) 1018.

The PROG 1018 includes program instructions that, when executed by the associated DP 1014, enable the various electronic devices and apparatus to operate in accordance with exemplary embodiments. That is, various exemplary embodiments may be implemented at least in part by computer software executable by the DP 1014 of the computer 1010, or by hardware, or by a combination of software and hardware (and firmware).

The computer 1010 may also include dedicated processors, for example finFET modeling processor 1015.

The computer readable MEM 1016 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1014 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Based on the foregoing it should be apparent that various exemplary embodiments provide a method to fabricate dual gate finFET devices.

Figure 8:
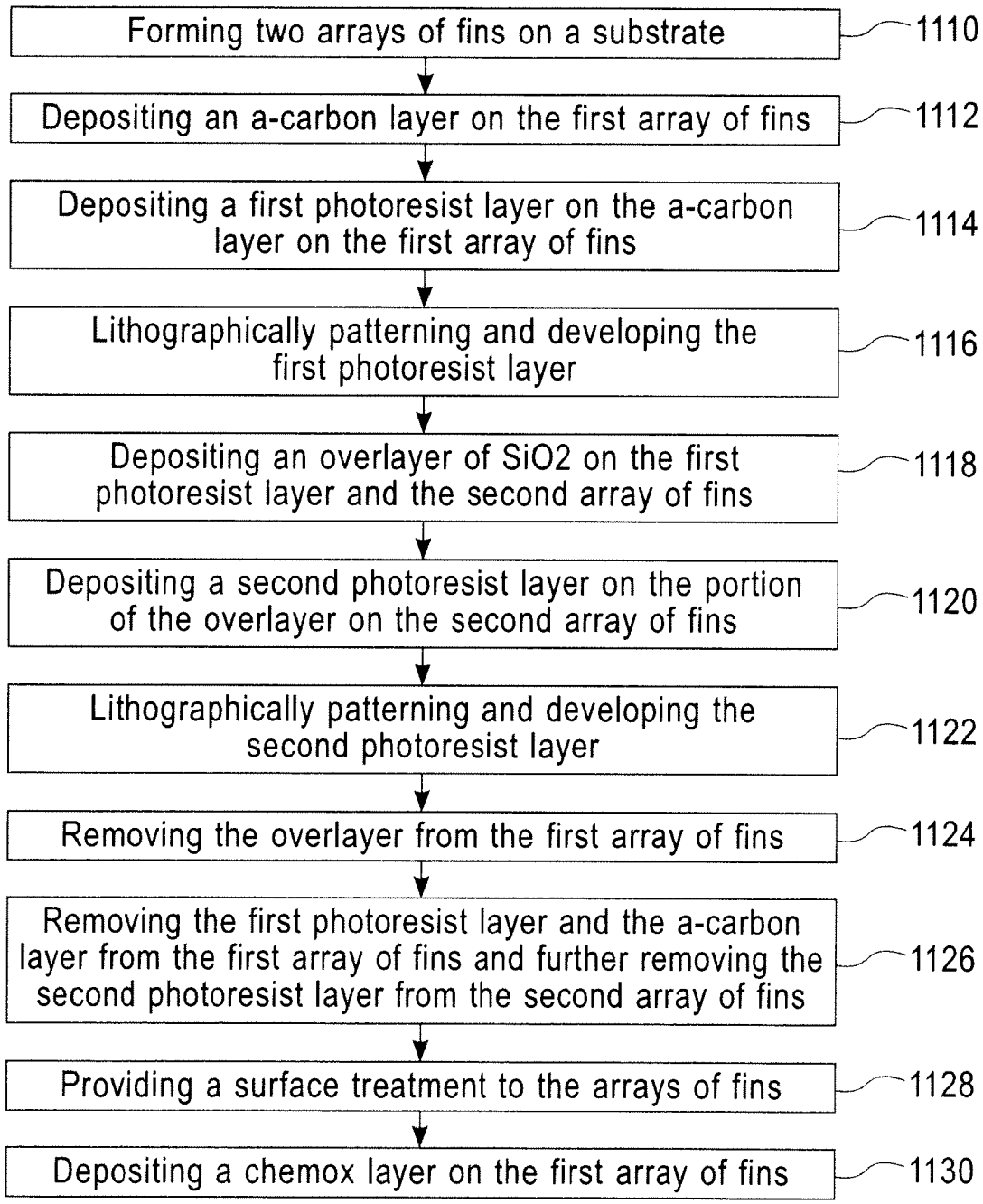
FIG. 8 is a logic flow diagram that illustrates the operation of an exemplary method, and a result of execution of computer program instructions embodied on a computer readable memory, in accordance with an exemplary embodiment of the manufacture of finFETs.

FIG. 8 is a logic flow diagram that illustrates the operation of a method (and a result of an execution of computer program instructions (such as PROG 1018)), in accordance with the exemplary embodiments. In accordance with these exemplary embodiments, at block 1110, two arrays of fins 22 are formed on the substrate 18. At block 1112, an a-C layer 28 is deposited on the first array of fins 22. At block 1114, a first photoresist layer 30 is deposited on the a-C layer 28. The first photoresist layer 30 is then lithographically patterned and developed as per block 1116.

At block 1118, a dielectric overlayer 36 of $SiO_2$ is deposited on the first photoresist layer 30 as well as on the second array of fins 22. A second photoresist layer 38 is then deposited on the portion of the overlayer 36 on the second array of fins, as shown in block 1120. The second photoresist layer 38 is then lithographically patterned and developed in block 1122.

As shown at block 1124, the overlayer 36 is removed (e.g., via a wet process utilizing acids) from the first array of fins 22. At block 1126, the first photoresist layer 30, the a-C layer 28, and the second photoresist layer 38 are then removed from the second array of fins 22. The method then performs, at block 1128, surface treatment of the fins 22.

As shown at block 1130, a chemox layer (thin coating of $SiO_2$) is then deposited on the first array of fins 22

The various blocks shown in FIG. 8 may be viewed as method steps, and/or as operations that result from operation of computer program code, and/or as a plurality of coupled logic circuit elements constructed to carry out the associated function(s).

The foregoing description has provided by way of exemplary and non-limiting examples a full and informative description of the best method and apparatus presently contemplated by the inventors for carrying out various exemplary embodiments. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. A device, comprising:
    a first plurality of fins on a semiconductor substrate, the first plurality of fins including a semiconductor material and extending perpendicular from the semiconductor substrate;
    a second plurality of fins on the semiconductor substrate, the second plurality of fins including a semiconductor material and extending perpendicular from the semiconductor substrate;
    a chemox layer deposited on lower portions of the fins of the first plurality of fins to a thickness of about 7 Angstroms to about 10 Angstroms; and
    a dielectric layer deposited on the fins of the second plurality of fins and substantially completely covering the fins to a thickness of about 20 Angstroms to about 50 Angstroms;
    wherein the dielectric layer is thicker than the chemox layer; and
    wherein the chemox layer is not deposited on the dielectric layer.

2. The device of claim 1, further comprising a gate material disposed over the first plurality of fins, the chemox layer, and the dielectric layer.

3. The device of claim 2, wherein the gate material is polysilicon.

4. The device of claim 1, wherein the semiconductor substrate is selected from the group consisting of single-crystal silicon, silicon alloy, germanium, and germanium alloy.

5. The device of claim 1, wherein the semiconductor material of the fins of the first plurality of fins and the second plurality of fins is selected from the group consisting of single-crystal silicon, silicon alloy, germanium, germanium alloy, and a combination of both silicon and germanium.

6. The device of claim 1, wherein the first plurality of fins in part defines an SG device and the second plurality of fins defines an EG device.

7. The device of claim 1, wherein the dielectric layer deposited on the fins of the second plurality of fins is silicon dioxide.

8. The device of claim 1, wherein the semiconductor substrate comprises silicon and the chemox layer comprises at least one of silicon oxide, silicon oxynitride, and nitrided silicon oxide.

* * * * *